US006566948B1

(12) United States Patent
Braithwaite

(10) Patent No.: US 6,566,948 B1
(45) Date of Patent: May 20, 2003

(54) METHOD AND SYSTEM FOR REDUCING NON-LINEARITIES

(75) Inventor: Richard Neil Braithwaite, San Carlos, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/084,702

(22) Filed: Feb. 26, 2002

(51) Int. Cl.[7] .................................................. H03F 1/26
(52) U.S. Cl. ........................ 330/149; 330/136; 375/297
(58) Field of Search ............................. 330/136; 4/149; 375/297

(56) References Cited

U.S. PATENT DOCUMENTS

| 5,049,832 A | 9/1991 | Cavers |
| 5,420,536 A | 5/1995 | Faulkner et al. |
| 5,650,758 A | 7/1997 | Xu et al. |
| 5,742,201 A | 4/1998 | Eisenberg et al. |
| 2001/0016354 A1 * | 7/2001 | Lee .............................. 330/149 |

OTHER PUBLICATIONS

Martin Weiss, "Check Amplifier Dynamic Behavior With True Test Signals", Microwaves & RF, Dec. 2000, pp. 47–54.

* cited by examiner

Primary Examiner—Michael B Shingleton

(57) ABSTRACT

Non-linearities of signal-generation circuits that typically include a series arrangement of a modulator and a power amplifier are reduced by connecting a measurement circuit to an output of the signal-generation circuit and at another point along a signal path of the signal-generation circuit. A predistorted input signal is applied to an input of the signal-generation circuit. The pre-distorted signal includes a constant component and a time-varying component, such that the predistorted input signal excites non-linear modes of the signal-generation circuit. The measurement circuit is balanced so that a portion of the predistorted input signal that passes through the measurement circuit does not include a time-varying component and therefore does not excite non-linearities of the measurement circuit. Adjustments are made to the predistorted input signal in order to reduce non-linearities of the signal-generation circuit.

29 Claims, 3 Drawing Sheets

METHOD AND SYSTEM FOR REDUCING NON-LINEARITIES

BACKGROUND OF THE INVENTION

1. Technical Field of the Invention

The present invention relates in general to the field of signal generation, and in particular, by way of example but not limitation, to reduction of non-linearities in signal-generation circuits. A major objective of the present invention is to reduce non-linearities in signal-generation circuits.

2. Description of Related Art

Attempts to improve the linearity of a series combination of a modulator and power amplifier (PA) include: (a) choosing components that are more linear; and (b) using linearization techniques such as, for example, feedback, feedforward, and pre-distortion. Feedback generally refers to feeding back at least a part of a signal to a delayed version of the signal in order to correct the signal substantially in real time. Feedforward generally refers to correcting a signal in advance so the future signals are corrected. Because components that exhibit greater linearity are often more expensive than components that exhibit lesser linearity, linearization techniques that correct non-linearities of the less-linear components have been pursued.

Feedback linearization generally has two forms: 1) polar; and 2) Cartesian. Linearization can be applied to either a base-band signal, an IF (intermediate-frequency) signal (if one exists), or a radio-frequency (RF) signal. In general, feedback loop delays tend to limit the available signal bandwidth and can lead to instability if bandwidth restrictions are exceeded.

Feedforward linearization operates by measuring distortion from non-linearities, delaying a main signal, and subtracting the distortion from the main signal using the measured distortion. Feedforward linearization tends to be used for reducing effects of non-linearities in RF components, such as, for example, a PA. Modulator errors are not typically corrected using feedforward linearization. Feedforward linearization performance is typically limited by the quality of a second, reference amplifier, used to amplify the measured distortion. Disadvantages of using feedforward compensation include expense and the need for precise balances between reference and signal paths in order to obtain acceptable performance.

Pre-distortion linearization involves the introduction of non-linearities into a signal path. The non-linearities are then used to counteract non-linearities present in the original components, such as, for example, the modulator and the PA. An objective of pre-distortion is to keep constant the gain of the series combination of a pre-distorter (PD), the modulator, and the PA, despite instantaneous signal power-level variations due to time-varying (e.g., amplitude-modulation (AM)) components of the signal. Pre-distortion linearization can be applied anywhere along the signal path; however, in certain applications, pre-distortion linearization of the base-band or of the RF signal might be preferred.

Pre-distortion linearization typically compensates for the modulator and PA non-linearities by modeling as a parametric function a time-varying inverse of the non-linear gain of the system. Pre-distortion parameters that minimize the output distortion are also usually estimated. When the pre-distortion is perfect, the parameters of the inverse non-linear gain are identical to those minimizing the output distortion. Adaptive estimation of the pre-distortion parameters is desirable because the gain can drift over time.

The adaptive parameter estimation typically requires that the gain variations be measured accurately. Inaccurate measurements of the gain variations can bias the parameter estimation, thereby impairing the performance of pre-distortion linearization.

An inherent problem with adaptive approaches to linearization is that the system being linearized cannot distinguish distortion induced by non-linearities of, for example, the modulator or the PA within the signal path from non-linearities induced by measurement components used to measure the non-linearities within the signal path. As a result, many currently-known adaptive pre-distortion linearization approaches require ultra-linear measurement components. These ultra-linear measurements are often prohibitively expensive.

From the foregoing it can be seen that non-linearities of signal-generation circuits have required ultra-linear measurement components, which are often prohibitively expensive. What is needed is a method and system for reducing non-linearities in signal-generation circuits that improve the linearity of such circuits without requiring ultra-linear measurement components.

SUMMARY OF THE INVENTION

The present invention provides a method and system for improving the linearity of circuits such as signal-generation circuits using a measurement circuit that is not required to be ultra-linear and is therefore less expensive than other approaches. A time-varying signal with an AM component is input to a circuit in order to excite non-linearities of the circuit. The measurement circuit is balanced to remove the AM component so that the resulting signal does not excite any non-linearities of the measurement circuit. Any such non-linearities of the measurement circuit are minimized by extracting a portion of the signal that passes through the circuit. The extracted portion does not have a substantial time-varying component. Thus, non-linearities of the measurement circuit are not excited, while non-linearities of the circuit are excited and can therefore be measured and subsequently corrected.

In an embodiment of the present invention, a method of reducing non-linearities of a circuit includes providing and pre-distorting an input signal. The input signal includes a constant component and a time-varying component. The pre-distorted input signal is input to the circuit and an output signal is obtained from the circuit. A carrier signal is subtracted from the output signal, thereby yielding an error signal. An error signal envelope is determined and is demodulated using a demodulating signal related to the input signal. The parameters of the pre-distorted input signal are adjusted with reference to the demodulated converted error signal, thereby causing an amplitude of the error signal envelope to approach a constant value.

In another embodiment of the present invention, a system for reducing non-linearities includes an input-signal-generation circuit and a carrier-signal-generation circuit. The signal-generation circuit is adapted to generate an input signal having a constant component and a time-varying component. The carrier-signal-generation circuit is adapted to generate a carrier signal. The circuit includes an input connected to the input-signal-generation circuit and adapted to receive the input signal and a modulator connected to the carrier-signal-generation circuit and adapted to modulate the input signal with the carrier signal. The circuit also includes an amplifier, connected to the modulator, adapted to amplify the modulated input signal. An output is connected to the amplifier and is adapted to output the modulated amplified input signal. The system includes a pre-distorter that is adapted to adjust signal parameters. The pre-distorter is connected to the circuit. There is also a measurement circuit connected to the carrier-signal-generation circuit and to the output. The measurement circuit is adapted to yield an envelope of an error signal. The envelope comprises a function of an imbalance of the measurement circuit. Pre-distortion parameter adjustments are used to cause an amplitude of an envelope of the error signal to approach a constant value, thereby reducing non-linearities of the circuit.

The above-described and other features of the present invention are explained in detail below with reference to illustrative examples shown in the accompanying Drawings. Those of ordinary skill in the art will appreciate that the described embodiments are provided for purposes of illustration and understanding and that numerous equivalent embodiments are also contemplated in this patent application. Furthermore, the present invention provides embodiments with other features and advantages in addition to or instead of those discussed above. Many of the features and advantages are apparent from the description below with reference to the following drawings:

BRIEF DESCRIPTION OF THE DRAWINGS

A more complete understanding of the present invention can be achieved by reference to the following Detailed Description when taken in conjunction with the accompanying Drawings wherein:

FIG. 4(*b*) is a graph of a local oscillator signal and an output signal of a signal-generation circuit that is non-linear;

DETAILED DESCRIPTION OF THE EXEMPLARY EMBODIMENTS OF THE INVENTION

In the following Detailed Description, specific details are set forth in order to provide a thorough understanding of embodiments of the present invention. However, it will be apparent to those of ordinary skill in the art that the present invention can be practiced in other embodiments that depart from these specific details. In other instances, detailed descriptions of well-known methods, devices, logical code (e.g., hardware, software, firmware), and the like are omitted so as not to obscure description of embodiments of the present invention. Preferred embodiments of the present invention and its advantages are best understood by referring to FIGS. 1–6 of the Drawings, in which like numerals are used for like and corresponding parts of the various Drawings.

Figure 1:
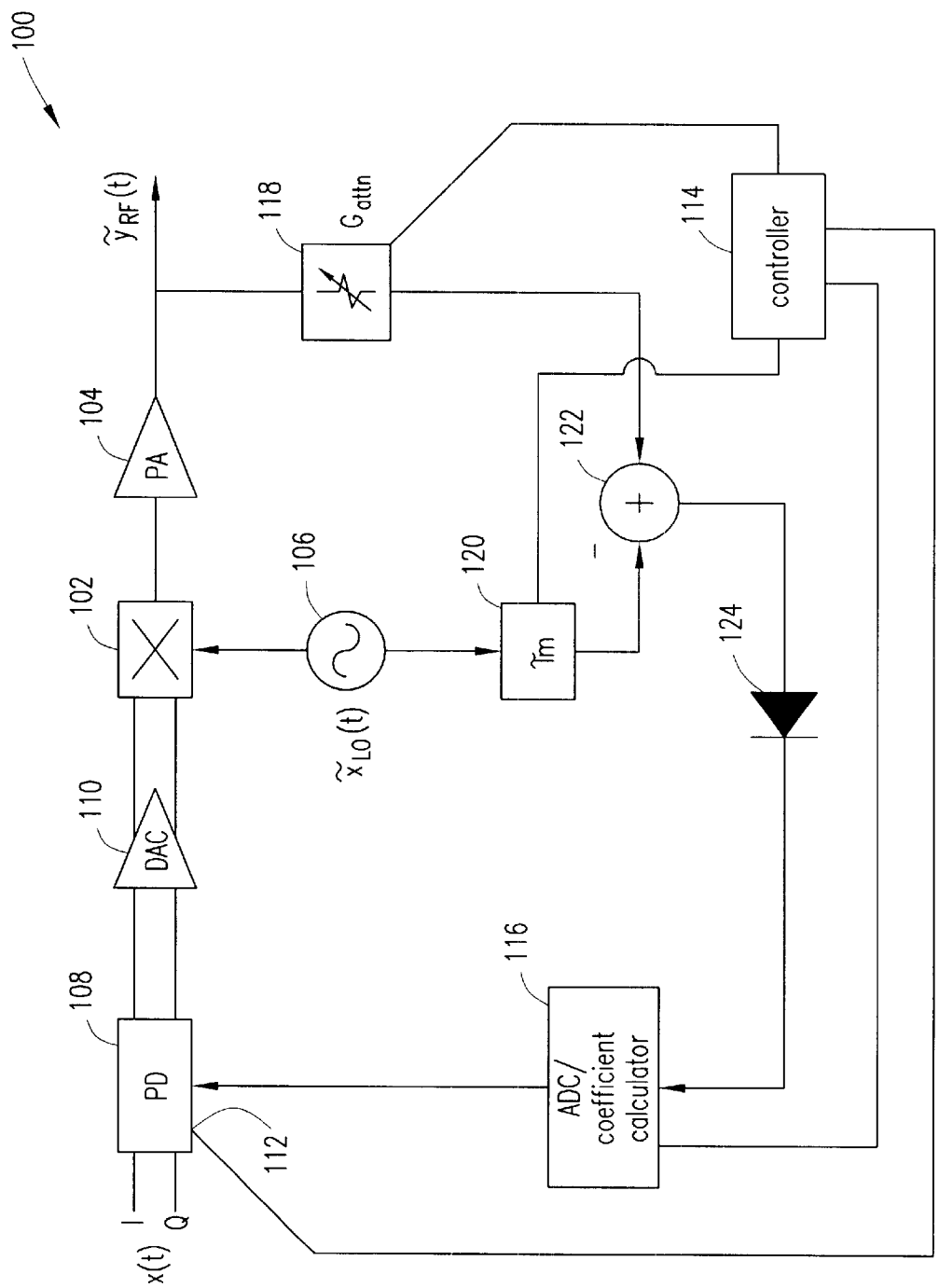
FIG. 1 is a block diagram of a linearization circuit in accordance with teachings of the present invention.

FIG. 1 is a block diagram of a linearization circuit 100 in accordance with teachings of the present invention. The linearization circuit 100, which has a base-band input signal x(t), could be, for example, an Agilent ESG-D Falcon signal generator. The base-band input signal x(t) comprises a quadrature pair of base-band signals, denoted by I and Q (i.e., in-phase and quadrature components), respectively. An output of the linearization circuit 100 is an RF signal denoted by $\tilde{y}_{RF}(t)$. Along a signal path of the linearization circuit 100, a modulator 102 and a power amplifier (PA) 104 are arranged in series. A local oscillator (LO) 106 provides an RF input signal $\tilde{x}_{LO}(t)$ to the modulator 102.

To compensate for non-linearities of the modulator 102 and the PA 104, pre-distortion can be applied anywhere along the signal path. Even though pre-distortion can be applied anywhere along the signal path, such as, for example, prior to the modulator 102, on the RF signal path between the modulator 102 and the PA 104, or after the PA 104, pre-distortion of the base-band input x(t) is often preferred because of ease of implementation.

A pre-distorter (PD) 108 distorts x(t) and then provides a pre-distorted signal to a digital-to-analog converter (DAC) 110, which outputs to the modulator 102. Pre-distortion settings 112 can be made to the PD 108 via a controller 114. The pre-distortion settings 112 allow adjustments to be made to parameters of the PD 108 in order to improve linearity of the linearization circuit 100.

An output signal of the modulator 102 is input to the PA 104. The controller 114 is also coupled to an analog-to-digital-converter/coefficient calculator (ADC/coefficient calculator) block 116, to a gain-adjustment block 118, and to a phase-adjustment block 120 in order to make adjustments to any of the blocks 116, 118, or 120.

The output signal $\tilde{y}_{RF}(t)$ is fed to an output device, such as, for example, an antenna, and also to the gain-adjustment block 118. The output of the gain-adjustment block 118 is fed to a combiner 122, which also receives the inverse of the output of the LO 106, after phase adjustment by the phase-adjustment block 120, as an input. The gain-adjustment block 118 and the phase-adjustment block 120 are used to align the gain and phase of the output signal and of the output of the modulator 102 so that each of the signals is of similar phase and average power.

The combiner 122 subtracts the phase-adjusted output of the LO 106 from the gain-adjusted output of the linearization circuit 100. The output of the combiner 122 is fed to a diode 124, which produces an envelope signal of the output of the combiner 122. The diode 124 is output to the ADC/coefficient calculator 116, which makes adjustments to the PD settings 112 in order to improve the linearity of the linearization circuit 100.

Three principal levels of pre-distortion complexity can be implemented. For a lowest complexity implementation, the pre-distortion settings 112 of the PD 108 are adjusted manually. The pre-distortion settings 112 are typically adjusted via a one-time procedure. 1Higher complexity pre-distortion involves automatic adjustment of the pre-distortion settings 112. Automatic adjustment of the pre-distortion settings 112 can be grouped into two general classes: 1) off-line calibration, and 2) on-line adaptation. Off-line calibration uses known input signals to determine adjustments to the pre-distortion settings 112. In off-line calibration, use of the linearization circuit 100 is suspended. In contrast, in on-line adaptation, the settings 112 are adjusted while the linearization circuit 100 is in use and the input signal x(t) is being used.

In order to reduce non-linearities in the linearization circuit 100, gain error of the linearization circuit 100 between the input signal x(t) and the RF output signal $\tilde{y}_{RF}(t)$ is measured. A tuning algorithm of the controller 114 relates adjustments made to the pre-distortion settings 112 to the measured gain error between the input signal x(t) and the RF output signal $\tilde{y}_{RF}(t)$. An iterative process can be used to adjust the pre-distortion settings 112 of the PD 108 and, if the iterative process converges, the linearity of the linearization circuit 100 improves.

In accordance with teachings of the present invention, pre-distortion is used to reduce the non-linearities of the linearization circuit 100 on a signal path that includes the modulator 102 and the PA 104. The pre-distortion is applied to the signal path prior to the conversion of the signal from digital to analog by the DAC 110. However, in other embodiments, the pre-distortion can be applied anywhere along the signal path. Parameters of the pre-distortion function are preferably estimated via a calibration procedure that uses the input signal x(t). The estimated parameters are then fixed and are used to compensate for gain fluctuations associated with an arbitrary signal of similar average power to the input signal x(t).

In accordance with teachings of the present invention, linearity of devices that use modulators and amplifiers to convert base-band signals to RF can be improved. In addition, embodiments of the present invention eliminate offsets between desired gain and actual gain. Accordingly, the PD 108 can be made to introduce a non-linearity into the signal path of the linearization circuit 100 in order to compensate for subsequently-introduced non-linearities by, for example, the modulator 102 and the PA 104. The PD 108 is adjusted by inputting the signal x(t) (after pre-distortion) to the modulator 102 and measuring an error signal. As the pre-distortion reduces the gain offsets and improves the linearity of the linearization circuit 100, the error signal converges towards a constant value.

Selection of an appropriate input signal x(t) helps to ensure that non-linear modes within the modulator 102 and the PA 104 are stimulated and also enables extraction of a portion of the output signal $\tilde{y}_{RF}(t)$ that does not stimulate non-linear modes of any of the blocks 118 or 120 or of the combiner 122 or diode 124. As a result, accurate, bias-free parameter estimates can be obtained using inexpensive, relatively non-linear, components.

In embodiments of the present invention, the input signal x(t) comprises a constant (i.e., DC) component and a time-varying (e.g., complex exponential) component. The input signal x(t), also referred to as a probing signal, can be represented by a circle in the in-phase-quadrature plane that is offset from the origin by a constant component. The complex-exponential component of the input signal x(t) introduces a time-varying (e.g., AM) signal component.

Figure 2:
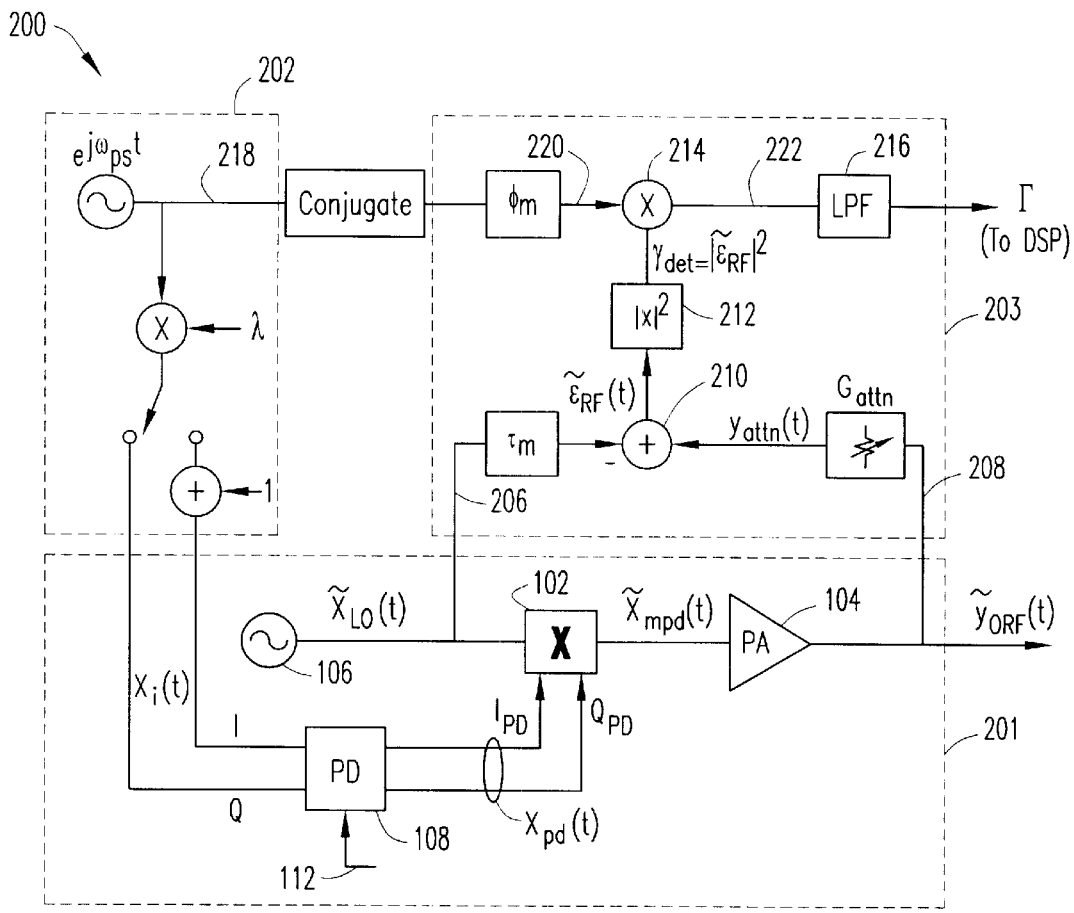
FIG. 2 is a block diagram of a linearization circuit in accordance with teachings of the present invention.

FIG. 2 is a detailed block diagram of a linearization circuit 200 in accordance with teachings of the present invention. The linearization circuit 200 includes a signal-generation circuit 201, an input-signal-generation circuit 202, and a measurement circuit 203. The input-signal-generation circuit 202 generates an input signal $x_i(t)$, which, in the embodiment represented in FIG. 2, includes a constant offset on the I-channel plus a weighted disturbance such that:

$$x_i(t)=1+\lambda \cdot s_{mod}(t) \qquad (1)$$

wherein $s_{mod}(t)$ is a time-varying signal and $\lambda$ is a modulation index. The signal $s_{mod}(t)$ performs two principal functions: (1) $s_{mod}(t)$ stimulates non-linear modes of the modulator 102 and the PA 104 by varying an amplitude of the input signal $x_i(t)$ and 2) $s_{mod}(t)$ disrupts an instantaneous balance of the measurement circuit 203, which can also be referred to as am measurement bridge circuit, so that optimal settings of the PD 108 can be determined.

An RF output signal of the circuit 201 can be described by:

$$\tilde{y}_{ORF}(t)=\sqrt{2}\cdot Re\{y_{ORF}(t)\cdot e^{j\omega_{LO}t}\} \qquad (2)$$

wherein $y_{ORF}(t)$ is a complex baseband signal, $\omega_{LO}$ is the carrier frequency in rad/sec, and $j=\sqrt{-1}$. Other signals shown in FIG. 4 are $\tilde{x}_{LO}(t)$ (i.e., the modulating, or LO, signal), $\tilde{x}_{mpd}(t)$ (i.e., a pre-distorted and modulated input signal), and $\epsilon_{RF}(t)$ (i.e., an RF error signal), wherein:

$$\tilde{x}_{LO}(t)=\sqrt{2}\cdot Re\{x_{LO}(t)\cdot e^{j\omega_{LO}t}\} \qquad (3)$$

$$\tilde{x}_{mpd}(t)=\sqrt{2}\cdot Re\{x_{mpd}(t)\cdot e^{j\omega_{LO}t}\} \qquad (4)$$

and $$\epsilon_{RF}(t)=\sqrt{2}\cdot Re\{\epsilon_{RF}(t)\cdot e^{j\omega_{LO}t}\} \qquad (5)$$

respectively, and $x_{LO}(t)$, $x_{mpd}(t)$, and $\epsilon_{RF}(t)$ are the respective complex baseband signals.

The LO signal $\tilde{x}_{LO}(t)$ output by the LO 106 is input to the modulator 102, which up-converts a pre-distorted input signal $\tilde{x}_{pd}(t)$ to RF, thereby yielding the modulated pre-distorted input signal $\tilde{x}_{mpd}(t)$. A phase-shifted version of the LO signal $\tilde{x}_{LO}(t)$ is subtracted from a gain-adjusted sample of the output signal $\tilde{y}_{ORF}(t)$, thereby yielding the error signal $\epsilon_{RF}(t)$.

The error signal $\epsilon_{RF}(t)$ is output by a combiner 210 of the measurement circuit 203. The measurement circuit 203 includes two paths, a reference path 206 and an output path 208, which are nominally balanced in terms of amplitude and are 180 degrees offset in phase from one another. The reference path 206 carries a replica of the signal $\tilde{x}_{LO}(t)$. The output path 208 carries a replica of the output signal $\tilde{y}_{ORF}(t)$. A delay $\tau_m$ and an attenuation $G_{attn}$ are inserted along the reference path 206 and the output RF path 208, respectively. The signals on the reference path 206 and the output path 208 are thereby made coincident in time and of similar power levels at the combiner 210 in order to minimize power of the error signal $\epsilon_{RF}(t)$.

When the measurement circuit 203 is balanced, the error signal $\epsilon_{RF}(t)$ has a virtually-circular trajectory within the IQ space and is centered on the origin of the IQ space. Deviations by $\tilde{y}_{ORF}(t)$ from a circular trajectory within the IQ space are indicative of non-linear modes or IQ errors of the signal-generation circuit 201. If an IQ error is present, the signal $\tilde{y}_{ORF}(t)$ is represented in the IQ space by an ellipse rather than by a circle, since there is a mismatch between the gain of the signal-generation circuit 201 on the I channel and the gain of the signal-generation circuit 201 on the Q channel. Non-linear modes can result from, for example, saturation of the PA 104, which compresses the circle, producing a trajectory having an elliptical component. When the measurement circuit 203 is balanced, and the circuit 201 is linear, the error signal $\epsilon_{RF}(t)$ has no time-varying component (i.e., the amplitude of $\epsilon_{RF}(t)$ is constant). As a result, inexpensive bridge circuitry that is not necessarily ultra-linear can be used in the measurement circuit 203 without introducing undesirable measurement biases that cannot be distinguished from non-linearities of the signal-generation circuit 201.

An envelope $\gamma_{det}$ of the error signal $\epsilon_{RF}(t)$ is obtained using a diode 212. The diode 212 preferably has a square-law response, so that the resulting signal $\gamma_{det}$ output by the diode 212 is represented by $\gamma_{det}=|\epsilon_{RF}|^2$. The diode 212 is used to convert the error signal $\epsilon_{RF}(t)$ into a response that is a function of the amplitude of the error signal $\epsilon_{RF}(t)$. The response of the diode 212 is ideally the absolute squared value of the amplitude of the signal $\epsilon_{RF}(t)$. Deviations from the ideal response have no significant deleterious effects on operation of embodiments of the present invention, because when the measurement circuit 203 is balanced, the signal $\epsilon_{RF}(t)$ includes substantially no time-varying component and therefore does not stimulate non-linearities of the measurement circuit 203.

$\gamma_{det}$ is demodulated by a demodulation element 214 using the conjugate of a signal 218 output by the input-signal-generation circuit 202. The signal 218 is related to the conjugate of $x_i(t)$, except that the signal 218 does not include a DC offset. The signal 218 output by the input-signal-generation circuit 202 is phase adjusted, as represented by $\phi_m$, so that the signal 218 and $\gamma_{det}$ are both in phase with one another. Following the phase adjustment of the signal 218, a resulting phase-adjusted signal 220 is input to the demodulation element 214. A demodulated signal 222 output by the demodulation element 214 is low-pass filtered by a low-pass filter 216, thereby outputting a complex measurement $\Gamma$, which is a function of imbalance of the measurement circuit 203 and is preferably input to digital-signal-processing circuitry (not shown) that computes adjustments to the pre-distortion settings 112.

In accordance with various embodiments of the present invention, the predistorted input signal $\tilde{x}_{pd}(t)$ is defined so that the amplitude of the signal $\epsilon_{RF}(t)$ is constant when the measurement circuit 203 is balanced, free from gain offsets, and the circuit 201 is linear. Because a constant-amplitude error signal does not stimulate non-linear modes within the diode 212, the effect of any non-ideal response of the diode 212 is thereby greatly reduced.

Consider the case in which $s_{mod}(t)$ of EQ (1) is $e^{j\omega_c t}$. The signal $\gamma_{det}$ output by the diode 212 typically includes a constant component, a fundamental frequency that has the same fundamental frequency as $x_{pd}(t)$, and a second harmonic frequency that is twice the fundamental frequency of $x_{pd}(t)$. Applying a digital Fourier transform (DFT) at the fundamental frequency, as a means to demodulate and filter $\gamma_{det}$, results in a complex measurement that is proportional to the gain imbalance between $\tilde{y}_{ORF}(t)$ and $\tilde{x}_{LO}(t)$ (i.e., the imbalance of the measurement circuit 203).

The DFT at the fundamental frequency is used to adjust the pre-distortion parameters in order to cancel out any residual carrier signal within the signal $\epsilon_{RF}(t)$. The DFT at the second harmonic frequency results a complex measurement that is proportional to elliptical deformations of the circular trajectory of the signal $x_i(t)$. The second-harmonic-frequency DFT is used to estimate non-linear modes that cause third-order inter-modulation distortion and also used to estimate IQ errors, including IQ gain imbalance and quadrature skew.

In order to resolve non-linearities due to IQ errors, the constant component of the input signal $x_i(t)$ is varied in terms of phase using PD 108 so that the average location of $x_{pd}(t)$ within the IQ space changes. The constant-component phase shift of $x_{pd}(t)$ is obtained by phase shifting $\tilde{x}_{LO}(t-\tau_m)$ within the measurement bridge (adjusting $\tau_m$), and then adjusting the signal path gain of PD 108 in order to balance the measurement circuit 203, thereby producing equal phase shift in $\tilde{y}_{attn}$, $\tilde{y}_{ORF}$, $\tilde{x}_{mpd}$ and $x_{pd}$. Since elliptical variations induced by IQ errors do not change with phase, the signal $\gamma_{det}$ remains constant (once the measurement bridge is rebalanced). However, elliptical variations induced by non-linearities follow the DC phase rotation of $x_{pd}$. A Kalman filter can be used to estimate the non-linear and IQ error parameters from a set of second harmonic measurements measured from a plurality of input phase shifts.

The PD 108 is preferably robust to uncertainty in the response of the diode 212, such as. For example, if the diode 212 does not exhibit a square-law response. If the diode 212 does not exhibit a square-law response, the primary effect is that a linear gain imbalance causes odd harmonics of the $x_{pd}(t)$ to appear in the signal $\gamma_{det}$. Such diode-induced harmonics of the signal $x_{pd}(t)$ are undesirable because they tend to mask any odd harmonics present in $\tilde{y}_{ORF}(t)$ resulting from non-linearities within the PA 104. For this reason, only the fundamental and second harmonic frequencies of $x_{pd}$ are used.

In order to estimate a gradient to be used to adjust coefficients of the PD 108 so that the linearity of the signal-generation circuit 201 improves, a model of the signal-generation circuit 201, including impairments and the PD 108, is needed. A general model of the PD 108, the modulator 102, and the power amplifier 104 connected in series (collectively DMPA), as shown in FIG. 4, is:

$$\tilde{x}_{mpd}(t) = [G_{pd}(x)] \cdot x \cdot e^{j\omega_{LO}t} \tag{6}$$

$$\tilde{y}_{ORF}(t) = (a)_{-1} + \left[ \sum_{k=0}^{n} \beta_k \cdot (a_k \cdot \tilde{x}_{mpd} + b_k \cdot \tilde{x}_{mpd}^*) + \frac{d\beta_k}{dt} \cdot r_k \cdot \tilde{x}_{mpd} \right] + \ldots \tag{7}$$

$$\beta_k = |\tilde{x}_{mpd}|^k \tag{8}$$

where $G_{pd}(x)$ is the gain of the PD 108. EQ (7) captures constant offsets ($a_{-1}$), IQ impairments ($a_o$, $b_o$), higher-order memoryless non-linearities ($a_k$ wherein k>0), and slew impairments ($r_k$). Even though EQ (7) has many coefficients, in general, the PD 108 will have only a few degrees of freedom.

A simple PD 108 with a gain offset and a power-related term can be represented by:

$$G_{pd}(x) = c_0 + c_2 \cdot |x|^2 \tag{9}$$

The PD 108 introduces a linear component and a memoryless third-order non-linearity. Gradient information can be obtained from the measurement circuit 203 that indicates adjustments to $c_0$ and $c_2$ that will improve the linearity of the DMPA. Four degrees of freedom are available to the PD: $\text{Re}\{c_0\}$, $\text{Im}\{c_0\}$, $\text{Re}\{c_2\}$, and $\text{Im}\{c_2\}$.

Since the limited degrees of freedom available to the PD 108 compensate primarily for the effects of $\alpha_0$, and $\alpha_2$, it can be assumed that all other coefficients in the modulator 102 and the PA 104 ($a_k$, $b_k$ and $r_k$) are zero. A simplified model of the DMPA is therefore:

$$y_{ORF}(t) = [\alpha_0 + \alpha_2 |x|^2] x \cdot e^{j\omega_{LO}t} \tag{10}$$

For the PD 108 to improve the linearity of the DMPA, it is advantageous to achieve the following:

$$\alpha_0 \approx 1 \tag{11}$$

$$\alpha_2 \approx 0 \tag{12}$$

If the non-linearity of the signal-generation circuit 201 is minimal, higher-order terms of $a_2$ and $c_2(|\alpha_2|^2, |c_2|^2, a_2 c_2, \ldots)$ can be neglected, and the following approximations can be used:

$$\alpha_0 = a_0 \cdot c_0 \tag{13}$$

$$\alpha_2 = a_0 \cdot c_2 + a_2 \cdot c_0 \cdot |c_0|^2 \tag{14}$$

Once the gradient with respect to ($\alpha_0$, $\alpha_2$) is obtained, then EQ (13) and EQ (14) can be used to calculate adjustments to $c_0$ and $c_2$. Although it is possible to compute update terms $\delta c_0$ and $\delta c_2$ from EQ (13) and EQ (14) directly, the values of $a_0$ and $a_2$ are required. In general, $a_0$ and $a_2$ are unknown. However, if it is assumed that $|c_2|<<|c_0|$ and that initial settings of the PD 108 are sufficiently accurate so that EQ (11) and EQ (12) are reasonable approximations, the following approximations can be used:

$$\begin{bmatrix} \delta c_0 \\ \delta c_2 \end{bmatrix} \approx c_0 \cdot \begin{bmatrix} 1 & 0 \\ \frac{3c_2}{c_0} & 1 \end{bmatrix}^{-1} \cdot \begin{bmatrix} \delta a_0 \\ \delta a_2 \end{bmatrix} \approx c_0 \cdot \begin{bmatrix} 1 & 0 \\ \frac{3c_2}{c_0} & 1 \end{bmatrix} \cdot \begin{bmatrix} \delta a_0 \\ \delta a_2 \end{bmatrix} \quad (15)$$

wherein ($\delta\alpha_0$, $\delta\alpha_2$) is the gradient of the gain coefficient of the DMPA.

Figures 3, 4A:
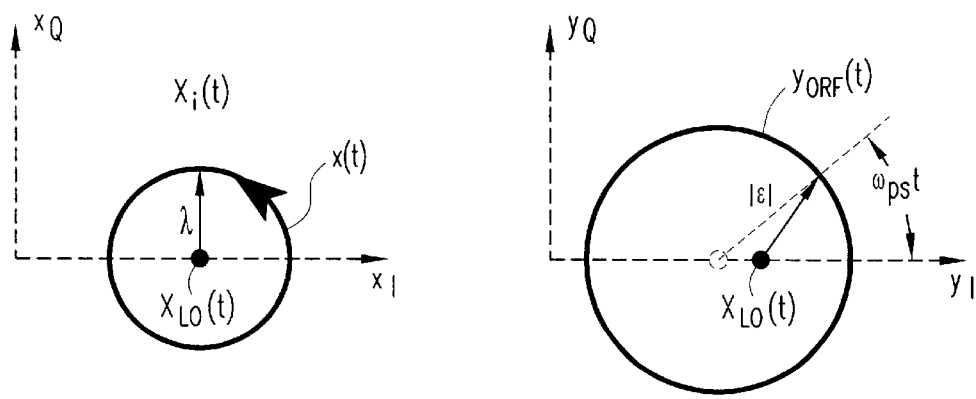
FIG. 3 is a graph of an exponential probing signal and local oscillator signal in accordance with teachings of the present invention.

FIG. 3 is a graph of an exemplary signal x(t) and the carrier signal $x_{LO}(t)$ when $s_{mod}(t)$ is a complex exponential signal:

$$x(t)=1+\lambda \cdot e^{j\omega_{ps}t} \quad (16)$$

$\lambda$ is real and positive. The trajectories of x(t) and $x_{LO}(t)$ within the IQ space are shown in FIG. 3. $x_{LO}(t)$ is the point at which $(x_I, x_Q)=(1,0)$ and x(t) is a circle of radius $\lambda$ that is offset from the origin by I=1. If the modulator 102 and the PA 104 are both linear, so that the circular trajectory of x(t) appears at the output signal $y_{ORF}(t)$ of the PA 104, the gain of the DMPA will determine the position of the circular trajectory of $y_{ORF}(t)$ relative to $x_{LO}(t)$. When the center of the area encompassed by the circle representing $y_{ORF}(t)$ and the point representing $x_{LO}(t)$ coincide, the gain is in balance in an average sense. In addition, $\epsilon_{RF}(t)$ will have a constant amplitude. As a result, any non-ideal response of the diode 212 is less significant. The trajectories of x(t) and $x_{LO}(t)$ do not intersect, which means that the measurement circuit 203, when balanced, never achieve an instantaneous balance, unless $\lambda=0$.

When there is a gain offset in the DMPA, the center of the circle and the dot are separated, as shown in FIG. 4(a). Separation of the center of the circle and the dot indicates that the measurement circuit 203 are not in balance, and that the average gain of the DMPA must be altered. Because of the imbalance, $\gamma_{det}$ will vary with a period of $T_1=2\pi/\omega_{ps}$. The amplitude and phase of the frequency component of $\gamma_{det}$ indicates the size and direction of the gain offset in the IQ space.

Figure 4B:
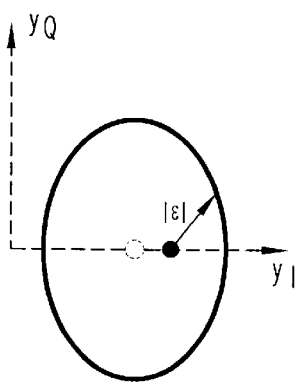
FIG. 4(*a*) is a graph of a local oscillator signal and an output signal of a signal-generation circuit having a gain offset.

When the DMPA is non-linear, the trajectory of $y_{ORF}(t)$ is compressed along one dimension of the IQ space, as shown in FIG. 4(b). Thus, as shown in FIG. 4(b), $\gamma_{det}$ has two significant modes whose periods are $T_1=2\pi/\omega_{ps}$ and $T_2=\pi/\omega_{ps}$. The modes of $\gamma_{det}$ are measured by demodulating using $e^{-j\omega_{ps}t}$ and $e^{-j2\omega_{ps}t}$, respectively, then low-pass filtering. For example, $$\Gamma_\theta = \frac{1}{T} \cdot \int_0^T \gamma_{det} \cdot e^{-j\omega_{ps}t} dt \quad (17)$$

$$\Gamma_{2\theta} = \frac{1}{T} \cdot \int_0^T \gamma_{det} \cdot e^{-j\omega_{ps}t} dt \quad (18)$$

wherein $\Gamma_\theta$ and $\Gamma_{2\theta}$ are first and second error measurements, respectively. The first and second error measurements provide useful information regarding the DMPA gain offsets and non-linearities.

In terms of the DMPA model coefficients, the first error measurement, $\Gamma_\theta$, is $$\Gamma_\theta = \lambda \cdot s_1 + \lambda^3 \cdot s_3 \quad (19)$$

$$s_1 = |\alpha_0|^2 - [\alpha_0 + \alpha_2 + 2 \cdot Re\{\alpha_2\}] + 2 \cdot (\alpha_0 \cdot \alpha_2{}^* + \alpha_2 \cdot \alpha_0{}^*) \quad (20)$$

$$s_3 = -\alpha_2 + 2 \cdot (\alpha_0 \cdot \alpha_2{}^* + \alpha_2 \cdot \alpha_0{}^*) \quad (21)$$

The second error measurement, $\Gamma_{2\theta}$, is $$\Gamma_{2\theta} = \lambda^2 \cdot [-\alpha_2 + (\alpha_0 \cdot \alpha_2{}^* + \alpha_2 \cdot \alpha_0{}^*)] \quad (22)$$

If $|\alpha_0 - 1|$ is small, $$\Gamma_\theta = \lambda \cdot [\alpha_0 \cdot (\alpha_0{}^* - 1) + \alpha_2{}^*] + \lambda^3 \cdot [2 \cdot Re\{\alpha_2\} + \alpha_2{}^*] \quad (23)$$

$$\Gamma_{2\theta} = \lambda^2 \cdot \alpha_2{}^* \quad (24)$$

$\Gamma_\theta$ and $\Gamma_{2\theta}$ are complex values. $\Gamma_\theta$ is a function of both the gain offset and the non-linearity, whereas $\Gamma_{2\theta}$ is a function of the non-linearity only.

Real and imaginary components of $\Gamma_\theta$ and $\Gamma_{2\theta}$ are used to obtain measurements of real and imaginary coefficients of predistortion settings 112 of the PD 108. That is, the values to be used in EQ (15) for updating the settings 112 of the PD 108 are given by:

$$\begin{bmatrix} \delta a_0 \\ \delta a_2 \end{bmatrix} = \begin{bmatrix} Re\{\alpha_0 - 1\} \\ Re\{\alpha_2\} \end{bmatrix} + j \cdot \begin{bmatrix} Im\{\alpha_0\} \\ Im\{\alpha_2\} \end{bmatrix} \quad (25)$$

Since it is assumed in EQ (23) and EQ (24) that $|\alpha_0 - 1|$ is small, $$\begin{bmatrix} Re\{\alpha_0 - 1\} \\ Re\{\alpha_2\} \end{bmatrix} = \frac{1}{\lambda} \cdot \begin{bmatrix} 1 & (1+3\lambda^2) \\ 0 & \lambda \end{bmatrix}^{-1} \cdot \begin{bmatrix} Re\{\Gamma_\theta\} \\ Re\{\Gamma_{2\theta}\} \end{bmatrix} \quad (26)$$

$$\begin{bmatrix} Im\{\alpha_0\} \\ Im\{\alpha_2\} \end{bmatrix} = \frac{-1}{\lambda} \cdot \begin{bmatrix} 1 & (1+\lambda^2) \\ 0 & \lambda \end{bmatrix}^{-1} \cdot \begin{bmatrix} Im\{\Gamma_\theta\} \\ Im\{\Gamma_{2\theta}\} \end{bmatrix} \quad (27)$$

Variations to the complex exponential signal can be used to produce a class of probing signals that possess the desired property of making $\gamma_{det}$ constant such that the DMPA is balanced and linear. Three exemplary probing/demodulation signal pairs are presented hereinbelow, each of which is each based on the circular trajectory shown in FIG. 3.

Figure 5:
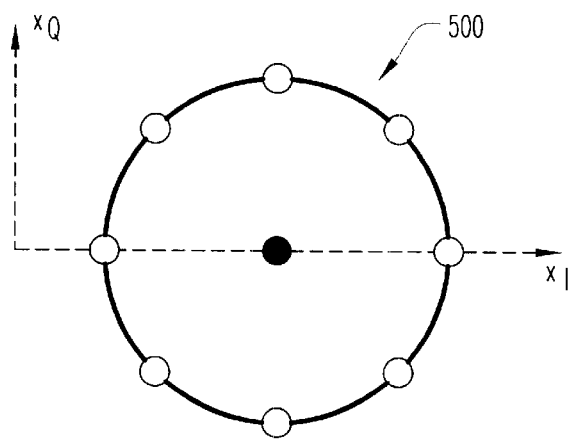
FIG. 5 is a graph of an exemplary probing signal.

FIG. 5 illustrates another exemplary probing signal. The speed at which a probing signal 500 travels around the trajectory is altered from that shown in FIG. 3. A demodulation signal $s_{demod}(t)$ used with the signal 500 employs a time-varying weight to keep the center of the circle as the optimal balance point.

The speed at which the signal 500 and the corresponding demodulation signal travel around the trajectory varies over time. The speed change is obtained by warping the time axis. The demodulation signal $s_{demod}(t)$ is weighted proportionally to the speed to eliminate measurement biases. The signal 500 can be represented by:

$$x(t) = c_0 \cdot [1 + \lambda \cdot e^{j\omega_{pd} \cdot h_t(t)}] \quad (28)$$

wherein $h_t(t)$ is a function that warps the time axis. Time-axis warping alters the slew-rate and frequency-content of the signal 500, which highlights memory-effects within the DMPA. The demodulation signal $s_{demod}(t)$ must also be modified to account for speed variations. The first error measurement becomes $$\Gamma_\theta = \frac{1}{T} \cdot \int_o^T \gamma_{det} \cdot (s_{demod}) dt \qquad (29)$$

wherein the demodulation signal is $$s_{demod}(t) = w(t) \cdot e^{-j\omega_{ps} h_t(t)} \qquad (30)$$

and w(t) is a time-varying weight. The term w(t) eliminates any bias in $\Gamma_\theta$, thus keeping the center of the circle as the linear balance point.

If the DMPA is linear and $c_0=1$, then the bias on $\Gamma_\theta$ is $$\Gamma_\theta = \frac{|\lambda|^2}{T} \cdot \int_0^T (s_{demod}) dt \qquad (31)$$

To eliminate any bias, a weight w(t) must be found that makes EQ (31) equal to zero over an observation interval [0,T]. If endpoints of the observation interval [0,T] are chosen such that $$e^{-j\omega_{ps} \cdot h_t(0)} = e^{-j\omega_{ps} h_t(T)} \qquad (32)$$

The interval starts and ends at the same position on the circular trajectory. If $h_t(t)$ is monotonic, then a suitable weight for eliminating the bias in $\Gamma_\theta$ is $$w(t) = \left|\frac{d}{dt} h_t(t)\right| \qquad (33)$$

By substituting EQ (33) into EQ (30), each point (differential arc segment) within the circular trajectory is given equal weight in determining the balance point.

An alternative demodulation signal can be used in which the weight w(t) is replaced by a sampling function that comprises a train of delta functions. An interval between samples is adjusted to compensate for the temporal warping associated with $h_t(t)$. If the pre-warped sample rate is uniform and an integer multiple (N) of the probing signal frequency, the sample points are limited to N locations on the trajectory, as shown in FIG. 5. Thus, $$w(t) = \delta[h_t(t) - h_t(kT)] \qquad (34)$$

wherein T is the re-warped sampling interval of $2\pi N/\omega_{ps}$. The positions of the sampling points with respect to the trajectory are identical; however, the temporal spacing of the samples is, in general, no longer uniform.

Figure 6:
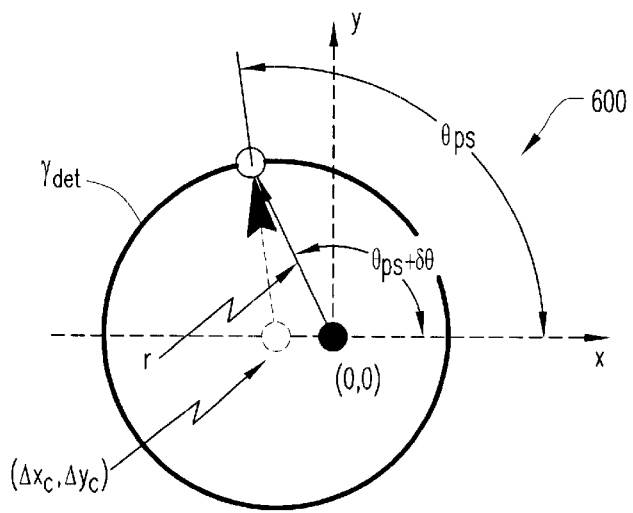
FIG. 6 is graph of a trajectory of a detected error signal of a linear DMPA that has gain offsets.

FIG. 6 illustrates a trajectory of a detected error signal of a linear DMPA that has gain offsets. A sampled demodulation signal is generalized to allow the direction of travel to be reversed at any time while still maintaining the center of the circle as the balance point. As a result, a new class of probing signals is available, including those whose travel is isolated to an arc on the circle. The demodulation signal has a sampled form.

Before generalizing the signal 600 and the corresponding demodulation signal to allow for direction reversals, it is necessary to review the estimation of the linear gain offsets that minimize the variance of $\gamma_{det}$. The estimate is then compared to the first error measurement $\Gamma_\theta$. In general, the estimate and the first error measurement $\Gamma_\theta$ are not equal; the difference is a measurement bias denoted by $\Gamma_{bias}$.

An approach that estimates and removes the bias differs from the signal of FIG. 5 in that $h_t(t)$ is not constrained to be monotonic. In FIG. 5, weighting and non-uniform sampling are used, respectively, to ensure that each part of the circle has equal influence in the estimate of the gain offsets. As a result, the use of arc trajectories is prohibited because the weight w(t) (or sampling density) would have to be infinite in a missing portion of the circle. Although the present approach permits computation of a gain offset for arcs, additional filtering is required to ensure stability in the presence of noise.

Consider a linear DMNPA that has gain offsets along the coordinate axes that are denoted by $\Delta x_c$ and $\Delta y_c$. The trajectory of $y_{det}$ is represented in polar form, wherein an instantaneous radius r is equal to $\gamma_{det}$. A phase of the trajectory of $\gamma_{det}$ is not equal to a phase of the probing signal except when the gain offsets are zero. The phase difference, denoted by $\delta\theta$, is assumed to be small.

Estimation of $\Delta x_c$ and $\Delta y_c$ involves minimizing the variance of $r = \gamma_{det}$. For the case of a sampled signal, the following cost function is minimized:

$$J = \sum_n w(n) \cdot \left\{[x^2(n) + y^2(n)]^{0.5} - R_o\right\}^2 \qquad (35)$$

wherein n is a sample index (sample obtained at time t=nT), w(n) is a weight assigned to sample n, $r(n) = \gamma_{det}(n)$, $R_o = E\{\gamma_{det}\}$, and $$x(n) = r(n) \cdot \cos[\theta_{ps}(n) + \delta\theta] - \Delta x_c \qquad (36)$$

$$y(n) = r(n) \cdot \sin[\theta_{ps}(n) + \delta\theta] - \Delta y_c \qquad (37)$$

$$\theta_{ps}(n) = n \cdot \frac{2\pi}{N} \qquad (38)$$

$$\sin(\delta\theta) = \frac{1}{r(n)} \cdot \{\Delta x_c \cdot \sin[\theta_{ps}(n)] + \Delta y_c \cdot \cos[\theta_{ps}(n)]\} \qquad (39)$$

If it is assumed that $\delta\theta$ is small (i.e., $\Delta x_c$ and $\Delta y_c$ are approximately zero), $$\Delta x_c = \left\{\frac{1}{N} \cdot \sum_n r(n) \cdot w(n) \cos[\theta_{ps}(n)]\right\} - \left\{\frac{R_o}{N} \cdot \sum_n w(n) \cos[\theta_{ps}(n)]\right\} \qquad (40)$$

$$\Delta y_c = \left\{\frac{1}{N} \cdot \sum_n r(n) \cdot w(n) \sin[\theta_{ps}(n)]\right\} - \left\{\frac{R_o}{N} \cdot \sum_n w(n) \sin[\theta_{ps}(n)]\right\} \qquad (41)$$

It is possible to relate EQ (40) and EQ (41) to the first error measurement:

$$\Gamma_\theta = \frac{1}{N} \cdot \sum_n \gamma_{det} \cdot w(n) \cdot e^{-j\theta_{ps}(n)} \approx [\Delta x_c - j \cdot \Delta y_c] + \Gamma_{bias} \qquad (42)$$

where $$\Gamma_{bias} = \frac{R_o}{N} \cdot \sum_n w(n) \cdot e^{-j\theta_{ps}(n)} \qquad (43)$$

If $\Gamma_{bias}$ is zero, the gain offsets can be computed without knowledge of $R_o$.

There are many probing signals that have $\Gamma_{bias} = 0$. One such set of signals is a sine wave whose frequency is altered, even reversed, every $2\pi$ rotations around the trajectory. That is, frequency changes or reversals are permitted at a single location on the trajectory.

EQ (43) only requires that the weighted average of the sample points be zero. That is, between samples, the probing signal is not constrained. In general, however, it is preferable to keep the detector error signal $\gamma_{det}$ constant both at and between sample points in order to avoid stimulating any memory effects within the response of the diode 212. An alternative, and more general, approach for estimating the gain offsets is to estimate and subtract $\Gamma_{bias}$ from the first error measurement, $\Gamma_\theta$. EQ (43) dictates that an estimate of $R_o$ be made. With an estimate of $R_o$, direction reversals are not restricted to a single location on the trajectory. As a result, even a partial trajectory (i.e., an arc) can be used as a probing signal.

Although preferred embodiment(s) of the present invention have been illustrated in the accompanying Drawings and described in the foregoing Description, it will be understood that the present invention is not limited to the embodiment(s) disclosed, but is capable of numerous rearrangements, modifications, and substitutions without departing from the scope of the present invention as set forth and defined by the following claims.

I claim:

1. A method of reducing non-linearities of a circuit, the method comprising:
   providing an input signal, wherein the input signal comprises a constant component and a time-varying component,
   pre-distorting the input signal;
   inputting the pre-distorted input signal to the circuit;
   obtaining an output signal from the circuit;
   subtracting a carrier signal from the output signal, thereby yielding an error signal;
   determining an envelope of the error signal;
   demodulating the envelope of the error signal using a demodulating signal related to the input signal;
   adjusting parameters of the pre-distorted input signal with reference to the demodulated converted error signal, thereby causing an amplitude of the envelope of the error signal to approach a constant value.

2. The method of claim 1, wherein the step of demodulating comprises performing a digital Fourier transform (DFT) on the envelope of the error signal.

3. The method of claim 1, wherein the step of determining the envelope of the error signal is performed by a diode.

4. The method of claim 2, wherein the envelope of the error signal comprises:
   a constant component;
   a fundamental tone; and
   a second harmonic tone.

5. The method of claim 1, wherein the step of adjusting comprises varying a phase of the constant component of the pre-distorted input signal.

6. The method of claim 1, wherein the step of adjusting comprises using a Kalman filter to estimate nonlinear and IQ error parameters based at least in part on a set of second harmonic tone measurements at a plurality of pre-distorted signal phase shifts.

7. The method of claim 4, wherein the DFT at the fundamental tone yields a complex value approximately proportional to a gain imbalance between the output signal and the carrier signal.

8. The method of claim 4, wherein the DFT at the first harmonic tone is used to balance gain between the output signal and the carrier signal.

9. The method of claim 1, wherein the pre-distorted input signal excites at least one non-linear mode of the signal-generation circuit.

10. The method of claim 1, wherein the step of adjusting comprises causing the error signal to have substantially no time-varying component.

11. The method of claim 1, further comprising low-pass filtering the demodulated envelope of the error signal prior to the step of converting.

12. The method of claim 1, wherein the constant value is zero.

13. A system for reducing non-linearities comprising:
   an input-signal-generation circuit adapted to generate an input signal having a constant component and a time-varying component;
   a carrier-signal-generation circuit adapted to generate a carrier signal;
   a signal-generation circuit comprising:
      an input connected to the input-signal-generation circuit and adapted to receive the input signal;
      a modulator connected to the carrier-signal-generation circuit and adapted to modulate the input signal with the carrier signal;
      an amplifier connected to the modulator and adapted to amplify the modulated input signal; and
      an output connected to the amplifier and adapted to output the modulated amplified input signal;
   a pre-distorter adapted to adjust signal parameters and connected to the signal-generation circuit;
   a measurement circuit connected to the carrier-signal-generation circuit and to the output and adapted to yield an envelope of an error signal, the envelope comprising a function of an imbalance of the measurement circuit; and
   wherein pre-distorter parameter adjustments cause an amplitude of the envelope of the error signal to approach a constant value, thereby reducing non-linearities of the signal-generation circuit.

14. The system of claim 13, wherein the measurement circuit comprises a diode.

15. The system of claim 14, wherein the diode yields the envelope of the error signal.

16. The system of claim 13, wherein the carrier signal and the output signal are aligned as to gain and at least one of phase and time.

17. The system of claim 13, wherein the measurement circuit comprises a demodulation element, the demodulation element being adapted to demodulate the envelope of the error signal using a signal related to the input signal.

18. The system of claim 13, wherein the measurement circuit comprises a low-pass filter adapted to low-pass filter the envelope of the error signal following demodulation of the envelope of the error signal.

19. The system of claim 18, wherein the low-pass filter is implemented via a digital Fourier transform (DFT).

20. The system of claim 17, wherein the demodulation is performed via a digital Fourier transform (DFT).

21. The system of claim 20, wherein the envelope of the error signal comprises:
   a constant component;
   a fundamental tone; and
   a second harmonic tone.

22. The system of claim 21, wherein the DFT at the second harmonic tone yields a complex value approximately proportional to deformations by the signal-generation circuit of the input signal.

23. The system of claim 21, wherein the DFT at the first harmonic tone is used to balance the measurement circuit.

24. The system of claim 21, wherein the DFT at the second harmonic tone is used to estimate non-linear-mode-producing third-order intermodulation distortion and in-phase-quadrature (IQ) errors.

25. The system of claim 13, wherein the pre-distorter parameter adjustments comprise varying a phase of the constant component of the pre-distorted input signal.

26. The system of claim 13, wherein the pre-distorter parameter adjustments comprise use of a Kalman filter to estimate nonlinear and IQ error parameters based at least in part on a set of second harmonic tone measurements at a plurality of pre-distorted signal phase shifts.

27. The system of claim 13, wherein the pre-distorted input signal exites at least one non-linear mode of the signal-generation circuit.

28. The system of claim 13, wherein the pre-distorter parameter adjustments cause the error signal to have substantially no time-varying component.

29. The system of claim 13, wherein the constant value is zero.

* * * * *